(12) United States Patent
Ker et al.

(10) Patent No.: US 10,236,770 B1
(45) Date of Patent: Mar. 19, 2019

(54) HIGH-VOLTAGE GENERATOR WITH MULTI-STAGE SELECTION IN LOW-VOLTAGE TRANSISTOR PROCESS

(71) Applicant: NATIONAL CHIAO TUNG UNIVERSITY, Hsinchu (TW)

(72) Inventors: Ming-Dou Ker, Hsinchu County (TW); Li-Chin Yu, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 15/912,585

(22) Filed: Mar. 6, 2018

(30) Foreign Application Priority Data

Nov. 27, 2017 (TW) .............................. 106141216 A (51) Int. Cl.
| | |
|---|---|
| H02M 3/07 | (2006.01) |
| G11C 29/02 | (2006.01) |
| G11C 5/14 | (2006.01) |
| H03K 17/687 | (2006.01) |
| H03K 17/06 | (2006.01) |
| H02M 1/00 | (2006.01) |

(52) U.S. Cl.
CPC .............. H02M 3/073 (2013.01); G11C 5/145 (2013.01); G11C 29/021 (2013.01); H03K 17/063 (2013.01); H03K 17/6871 (2013.01); H02M 2001/0003 (2013.01); H02M 2003/076 (2013.01); H02M 2003/077 (2013.01)

(58) Field of Classification Search
None
See application file for complete search history.

(56) References Cited

U.S. PATENT DOCUMENTS

| | | | | |
|---|---|---|---|---|
| 6,486,728 | B2 * | 11/2002 | Kleveland | H02M 3/073 |
| | | | | 327/390 |
| 8,339,185 | B2 | 12/2012 | Cazzaniga et al. | |
| 8,704,587 | B2 * | 4/2014 | Ramanan | G11C 5/145 |
| | | | | 327/536 |

(Continued)

FOREIGN PATENT DOCUMENTS

| | | |
|---|---|---|
| CN | 102290981 A | 12/2011 |
| CN | 203554284 U | 4/2014 |

(Continued)

OTHER PUBLICATIONS

Zhicong Luo et al., "Design of high-voltage-tolerant level shifter in low voltage CMOS Process for neuro stimulator", 14th IEEE International New Circuits and Systems Conference (NEWCAS), 2016.

*Primary Examiner* — Jeffery S Zweizig
(74) *Attorney, Agent, or Firm* — CKC Partners Co., LLC (57) ABSTRACT

The present disclosure relates to a high-voltage generator with multi-stage selection in low-voltage transistor process which include a boosted circuit, a plurality of switch and a feedback circuit. The boosted circuit includes multiple charge pump, so that can generate a DC output voltage higher or lower than the input signal. Turning on or turning off each switch controlled by a control signal respectively. Both ends of the circuit is connected to the output end of the high-voltage generator and charge pumps. By controlling the turning on or turning off each switch, it determines the magnitude of the boost and it also can ensure that switches will not be damaged due to excessive voltage difference.

10 Claims, 5 Drawing Sheets

(56) References Cited

U.S. PATENT DOCUMENTS

| | | | |
|---|---|---|---|
| 8,797,088 B2 | 8/2014 | Chan | |
| 10,033,271 B1 * | 7/2018 | Shay | ............. H03K 19/017509 |
| 2015/0015323 A1 | 1/2015 | Rahman et al. | |

FOREIGN PATENT DOCUMENTS

| | | | |
|---|---|---|---|
| CN | 104091613 A | 10/2014 |
| TW | 201301730 A | 1/2013 |
| TW | 201521340 A | 6/2015 |

* cited by examiner

HIGH-VOLTAGE GENERATOR WITH MULTI-STAGE SELECTION IN LOW-VOLTAGE TRANSISTOR PROCESS

CROSS-REFERENCE TO RELATED APPLICATION

This application claims priority to Taiwan Application Serial Number 106141216, filed Nov. 27, 2017, which is herein incorporated by reference in its entirety.

BACKGROUND

Technical Field

The present disclosure relates to a high-voltage generator with multi-stage selection in low-voltage transistor process. More particularly, it can boost an input signal through multiple charge pump.

Description of Related Art

In recent years, with the development of biomedical electronic technology, many new stimulator circuits have been designed for diagnosis, rehabilitation or prevention of disease generation and deterioration. The stimulator circuit is used to give electrical stimulation to the biological tissue. Since the impedance of biological tissue is too large, the stimulator circuit chip, which is used in the field of biomedicine, must be configured a "high-voltage generator" so as to allow the stimulator circuit operate normally and exert the expected effect.

In addition, since the impedance of biological tissue will be different with the application of the different ways, the high-voltage generator within the stimulator circuit must be able to vary with the impedance of biological tissue and provide an output voltage range between several volts and tens of volts so as to meet the needs of the application.

However, in practice, the stimulator circuit chip is often embedded in the organism, so the volume and area will be one of the key points in the design. Thus, how to reduce the size and the area of a stimulator circuit chip under the premise of ensuring the performance and durability of the stimulator circuit is an important target in the industry, and this is also the subject of the present disclosure to be discussed herein.

SUMMARY

One aspect of the present disclosure is a high-voltage generator with multi-stage selection in low-voltage transistor process. The high-voltage generator comprises a boost circuit, at least a first stage switch and a second stage switch and a feedback circuit. The boost circuit comprises at least a first stage charge pump and a second stage charge pump in series. An input end of the first stage charge pump is electrically coupled to an input end of the high-voltage generator. An input end of the second stage charge pump is electrically coupled to an output end of the first stage charge pump. An output end of the second stage charge pump is electrically coupled to an output end of the high-voltage generator. The first stage switch and the second stage switch are respectively connected in parallel with the first stage charge pump and the second stage charge pump, and each switch comprises at least one low-voltage transistor. The feedback circuit electrically is coupled to the output end of the high-voltage generator through a first end of the feedback circuit and electrically coupled to the charge pumps through a plurality of clock signal providing ends of the feedback circuit. When both of the first stage switch and the second stage switch are turned off, the high-voltage generator receives an input signal through the input end of the high-voltage, and boosts the input signal through the first stage charge pump and the second stage charge pump, sequentially. When the first stage switch is turned on and the second stage switch is turned off, the high-voltage generator boosts the input signal through the second stage charge pump. Voltages across the ends of the first stage switch and voltages across the ends of the second stage switch are not exceed one boost voltage difference.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

In the course of the research, the inventor found that the current high-voltage generator circuit chips can not completely balance performance, durability and volume. In order to flexibly generate a voltage of several volts to several tens of volts, there is a conventional method to change the pumping frequency of the charge pump in the high-voltage generator circuit and to stabilize the voltage passing through the feedback circuit. But this method is too low efficiency and lack of practicality.

In recent years, there is another high-voltage generator circuit, which is equipped with a multi-stage and independent boost circuits. According to the output voltage requirements, the high-voltage generator circuit will use the corresponding boost circuit. For example, when the input voltage needs to be doubled, a boost circuit with a single charge pump is driven. When the input voltage needs to be tripled, a boost circuit with two charge pumps in series is driven. Although this method can effectively ensure the conversion efficiency, it still will increase the volume so it is not a complete solution.

Figure 1:
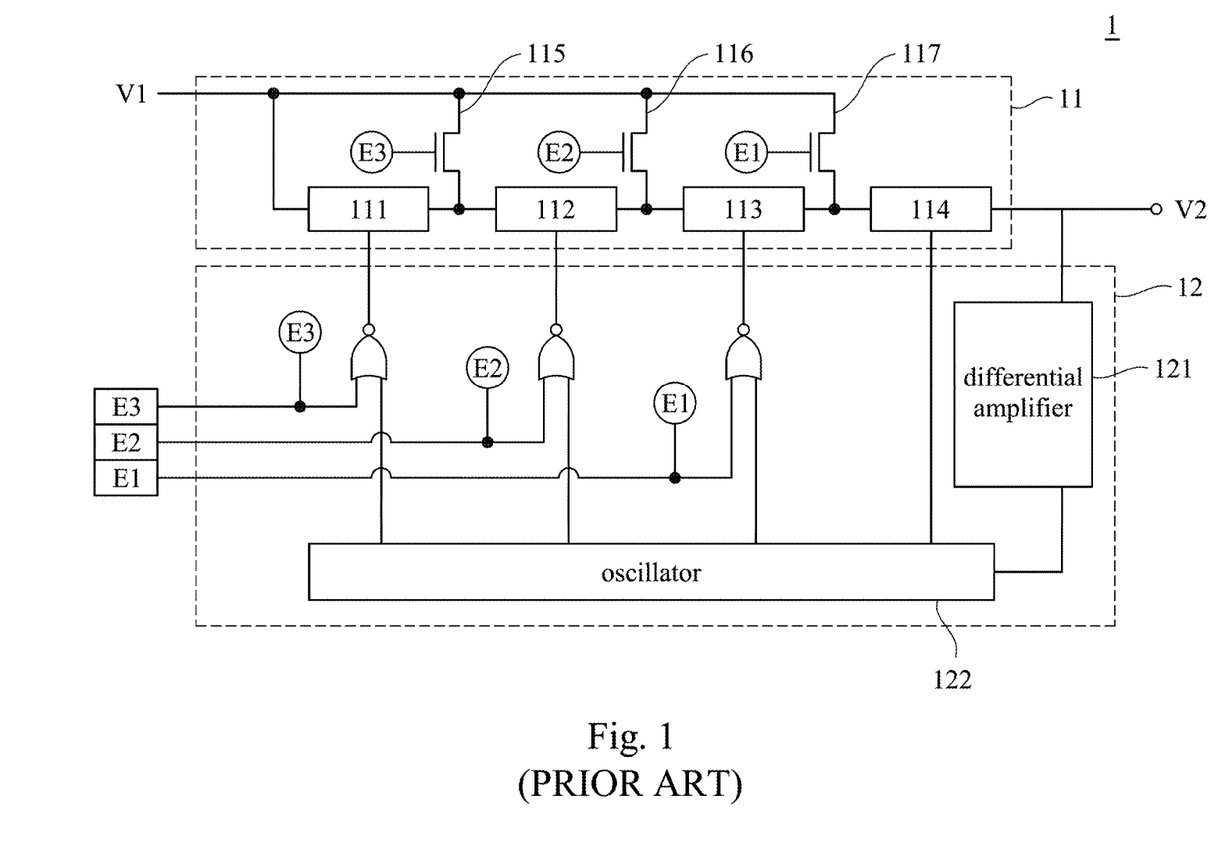
FIG. 1 is a schematic diagram of an improved high-voltage generator circuit.

FIG. 1 is another improved high-voltage generator circuit 1. The high-voltage generator circuit 1 includes a booster circuit 11 and a feedback circuit 12. The booster circuit 11 includes multiple charge pumps 111-114 and multiple switches 115-117. The feedback circuit 12 includes a differential amplifier 121 and an oscillator 122, and can receive control signals E1-E3 to control the charge pumps 111-114 and the switches 115-117.

For example, when the high-voltage generator circuit 1 needs to boost the signal double, the switches 115-117 are turned on so that the signal received by the input end V1 passes through the switches 115-117 without boost by the charge pumps 111-113. The high-voltage generator circuit 1 boosts the signal only by the charge pump 114. Similarly, when the high-voltage generator circuit 1 need to boost signal four times, it only needs to turn off all the switches 115-117, the four charge pumps 111-114 can be used to complete the voltage boost four times, and the boosted voltage is output from the output end V2.

However, the inventor found that the high-voltage generator shown in FIG. 1 has a great disadvantage in practical use. Use the operation mode of "boost signals four times" as an example, when the voltage of the input end V1 is VA, and the switches 115-117 are all turned off, the node between the charge pump 113 and the charge pump 114 will have four times the VA voltage (boosted three times). At this time, the switch 117 is not turned on, but the voltages across the ends of the switch 117 are three times VA (VA and four times of VA). This excessive voltage difference will easily cause damage to the switch 117.

The high-voltage generator shown in FIG. 1 can solve the problem of durability through using a "high-voltage process" to manufacture the switches 115-117. However, in the application of biomedical chips (for example, implanted chips for the suppression of epilepsy), in addition to the high-voltage generator, there are many components such as rectifiers, receivers, drivers and biological signal processors. If using a separate process to produce the high-voltage generator circuit, it is bound to unable to ensure that the biomedical chip is lightweight. On the other hand, If all components are made of high-pressure process, the volume can be saved, but will increase production costs. Thus, the high-voltage generator shown in FIG. 1 unable to balance multiple design requirements, such as efficiency, durability and volume.

Figure 2:
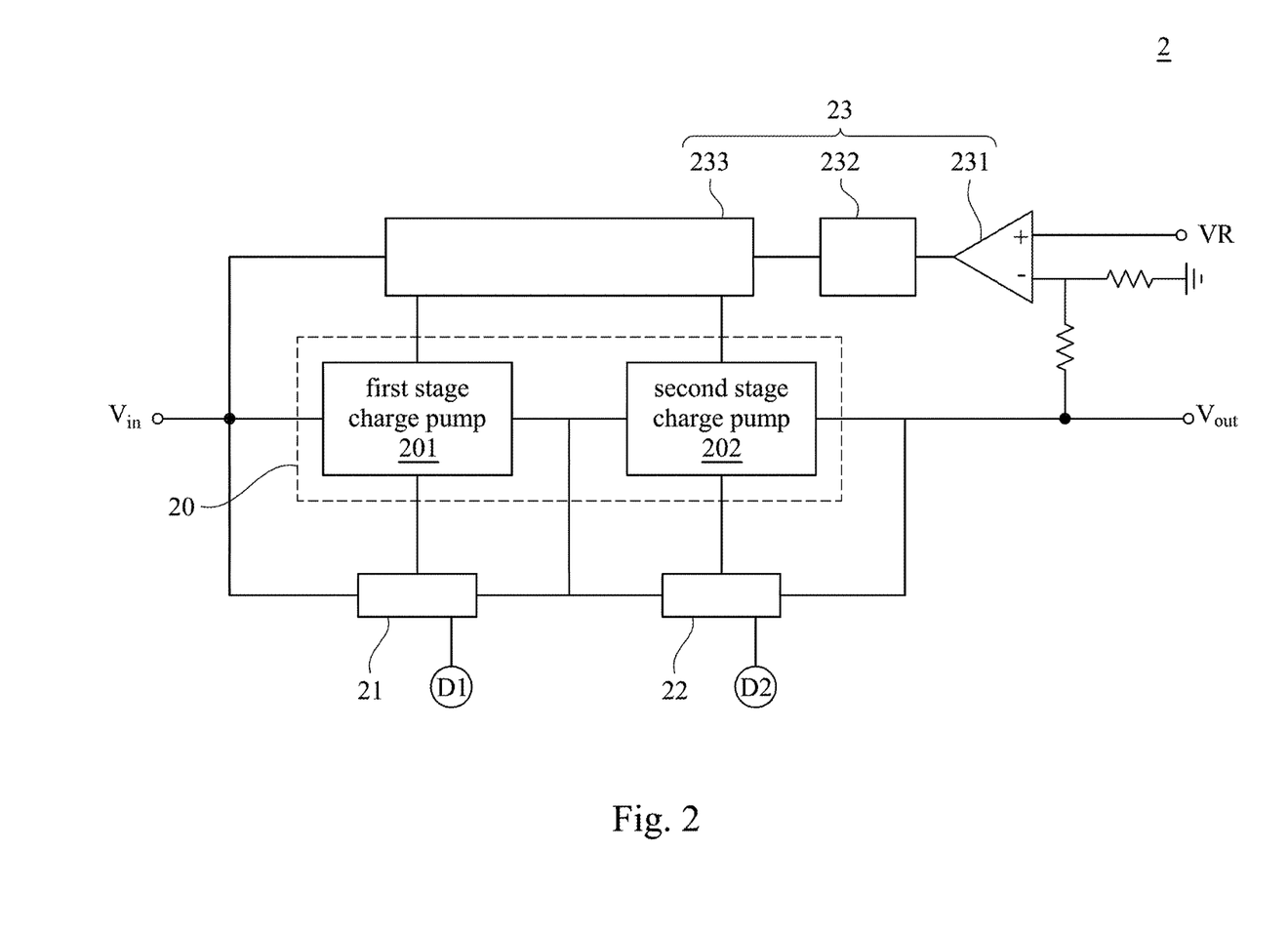
FIG. 2 is a schematic diagram of a high-voltage generator with multi-stage selection in low-voltage transistor process of the present disclosure.

In order to solve the aforementioned problems, the inventor designed a high-voltage generator of the present disclosure. FIG. 2 shows a schematic diagram of a high-voltage generator with multi-stage selection in low-voltage transistor process in some embodiments of the present disclosure. The high-voltage generator 2 is applied to a biomedical chip (as above, such as the implanted chips for the suppression of epilepsy), but not limited thereto.

The high-voltage generator 2 includes a boost circuit 20, at least a first stage switch 21, at least a second stage switch 22 and a feedback circuit 23. The boost circuit 20 is consists of at least a first stage charge pump 201 and a second stage charge pump 202 in series. However, the boost circuit 20 may also be increased in number according to design requirements. The input end of the first stage charge pump 201 is electrically coupled to the input end $V_{in}$ of the high-voltage generator 2. The input end of the second stage charge pump 202 is electrically coupled to the output end of the first stage charge pump 201. The output end of the second stage charge pump 202 is directly or indirectly electrically coupled to the output end $V_{out}$ of the high-voltage generator 2.

The first stage switch 21 is connected in parallel with the first stage charge pump 201. The second stage switch 22 is connected in parallel with the second stage charge pump 202. Each of the switches 21,22 is consists of at least one low-voltage transistor, and the detailed structure will be described later. However, the present disclosure is not limited to the structure of the switches. The switches 21, 22 can respectively receive the control signals D1 and D2 from the stimulator circuit chip (such as a driver in the chip) to determine the status of the switches D1 and D2.

A first end of the feedback circuit 23 is electrically coupled to the output end $V_{out}$ of the high-voltage generator 2. A plurality of clock signal providing ends of the feedback circuit 23 are electrically coupled to the charge pumps 201 and 202 respectively for providing a clock signal to each charge pumps 201, 202. For example, when the voltage at the output end $V_{out}$ of the high-voltage generator 2 is too low, the feedback circuit 23 can raise the frequency of the clock signal to speed up the operation frequency of the charge pump 201, 202 to effectively maintain the output end $V_{out}$ at high voltage. On the other hand, when the voltage at the output end $V_{out}$ of the high-voltage generator 2 is excessively high, the feedback circuit 23 can lower the frequency of the clock signal and slow down the operating frequency of the charge pump 201, 202 to effectively control the output end $V_{out}$ to the relatively low voltage, and then to stabilize the output voltage within an expected range. Refer to FIG. 2, each of the switches 21 and 22 can be turned on or off by the control signals D1 and D2, respectively. According to the switches 21, 22 are turned on or off, it is determined whether the charge pumps 201 and 202 boost the signal of the input $V_{in}$.

When both the first stage switch 21 and the second stage switch 22 are turned off, an input signal, which is received at the input end $V_{in}$ of the high-voltage generator 2, is sequentially transmitted through the first stage charge pump 201 and the second stage charge pump 202 to boost double. On the other hand, when the first stage switch 21 is turned on and the second stage switch 22 is turned off, the input signal $V_{in}$ is boosted only once by the second stage charge pump 202. At this time, the voltages across the first stage switch 21 are zero, and the voltages across the ends of the second stage switch 22 have only one boost voltage difference (that is, $V_{in}$). As mentioned above, each charge pump 201, 202 can adjust the frequency of operation according to the frequency of the received clock signal to ensure the overall operation efficiency of the high-voltage generator 2.

In the present disclosure, two ends of each of the switches 21 and 22 are respectively connected to the two ends of the corresponding charge pump 201 and 202 through connecting switches 21 and 22 in parallel to each of the charge pumps 201 and 202 respectively. In this way, no matter whether the switches 21 and 22 are turned on or turn off, there is only one boost voltage difference across of two ends of the switches 21 and 22, which will not damage the switches 21 and 22. Accordingly, the high-voltage generator 2 and other components can be integrated into a single chip by using a low-voltage process, and while ensuring the efficiency and durability, effectively control the production cost and the chip volume.

Figure 3:
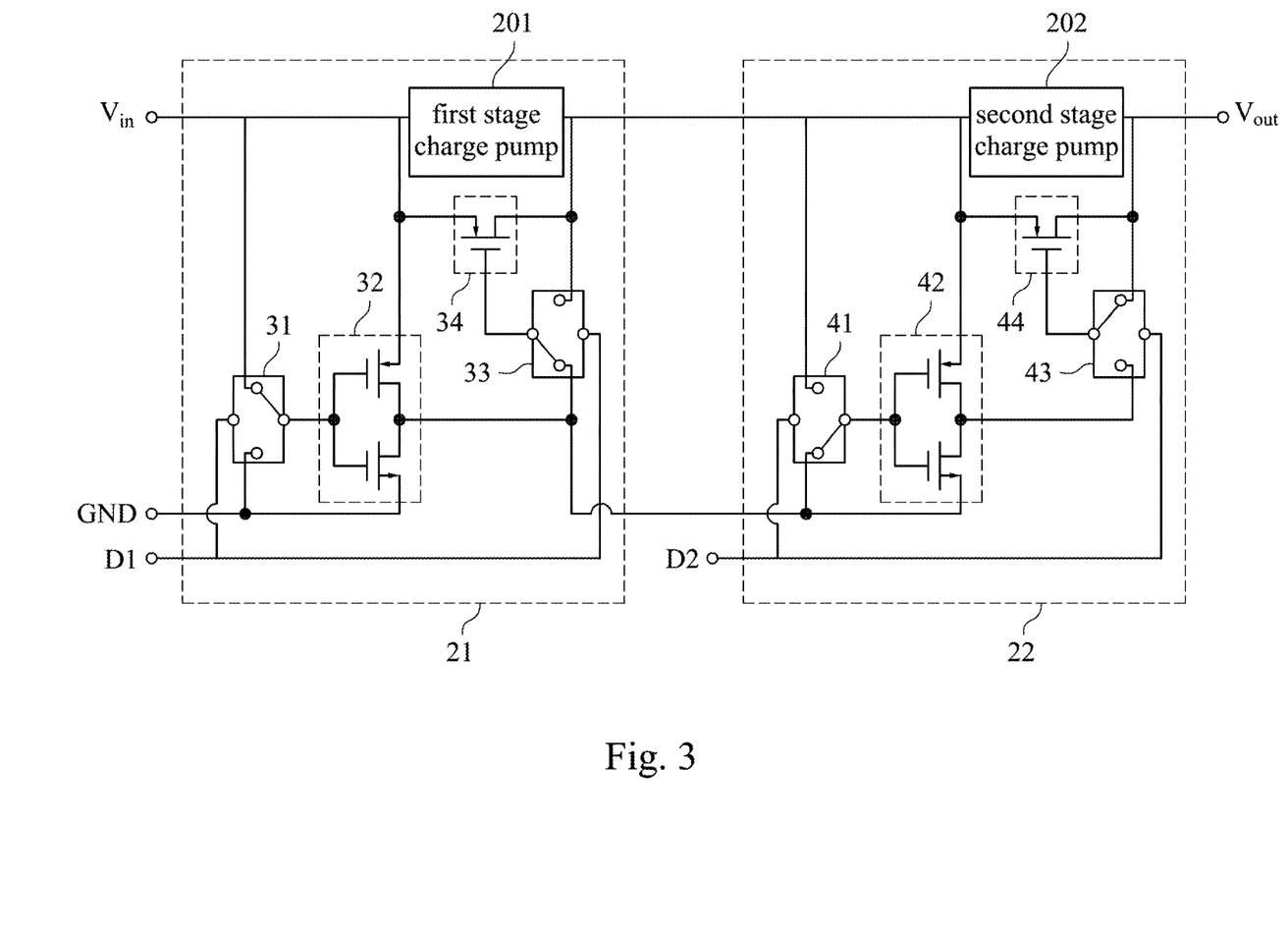
FIG. 3 is a partial circuit diagram of the high-voltage generator of the present disclosure.
Figure 4:
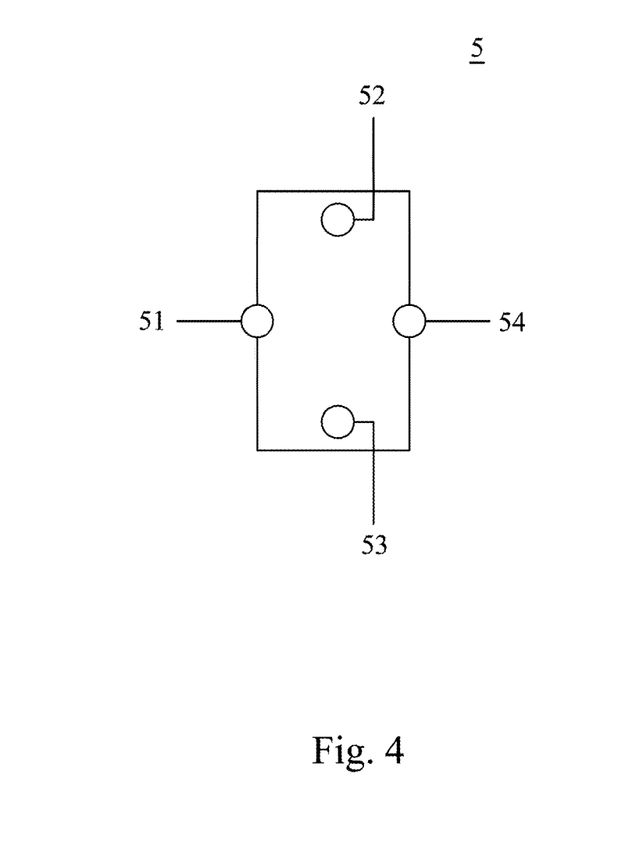
FIG. 4 is a schematic diagram of a SPDT switch of the present disclosure.

The structure of each of the switches 21 and 22 will be further described below. Please refer to FIG. 2-FIG. 4, wherein the high-voltage generator 2 in FIG. 3 omits the feedback circuit 23 so that to highlight the switches 21 and 22. The first stage switch 21 includes a first front single pole double throw (SPDT) switch 31, a first inverter 32, a first back single pole double throw (SPDT) switch 33 and a first transistor switch 34. In this embodiment, the internal circuit structures of the first front SPDT switch 31 and the first back SPDT switch 33 are the same. FIG. 4 shows a schematic diagram of SPDT switch, which includes a control end 51 and two switch ends 52,53 and a reaction end 54. However, the positions of the "reaction end 54" of the first front SPDT switch 31 and the first back SPDT switch 33 are different and will be described in detail later.

The control end of the first front SPDT switch 31 is configured to receive a control signal D1. The two switch ends of the first front SPDT switch 31 are respectively electrically coupled to the input end of the first stage charge pump 201 and a ground terminal GND. The input end of the first inverter 32 is electrically coupled to the reaction end of the first front SPDT switch 31. The control end of the first back SPDT switch 33 is also configured to receive the control signal D1. Two switch ends of the first back SPDT switch 33 are electrically coupled to the output end of the first stage charge pump 201 and the output end of the first inverter 32.

The first transistor switch 34 is consists of at least one low-voltage transistor. Two ends of the first transistor switch 34 are respectively connected in parallel with the first stage charge pump 201, and the control end of the first transistor switch 34 is electrically coupled to the reaction end of the first back SPDT switch 33.

The second stage switch 22 also includes a second front SPDT switch 41, a second inverter 42, a second back SPDT switch 43, and a second transistor switch 44. The control end of the second front SPDT switch 41 is configured to receive another control signal D2. The second switch end of the second front SPDT switch 41 is electrically coupled to the input end of the second stage charge pump 202 and the output end of the first inverter 32.

The input end of the second inverter 42 is electrically coupled to the reaction end of the second front SPDT switch 41. The control end of the second back SPDT switch 43 is configured to receive the other control signal D2. Two switch ends of the second back SPDT switch 43 are respectively electrically coupled to the output end of the second stage charge pump 202 and the output end of the second inverter 42. The second transistor switch 44 is consists of at least one low-voltage transistor. Two ends of the second transistor switch 44 are connected in parallel with the second stage charge pump 202, and a control end of the second transistor switch 44 is electrically coupled to the reaction end of the second back SPDT switch 43.

Similarly, the internal circuits of the second front SPDT switch 41 and the second back SPDT switch 43 have the same structure. As shown in FIG. 4, the SPDT switch includes a control end 51, two switch ends 52, 53 and a reaction end 54. However, the positions of the "reaction end 54" of the first front SPDT switch 31 and the first back SPDT switch 33 are different, and the difference will be described in detail later.

To facilitate understanding the operation mode of the high-voltage generator of the present disclosure, the operation mode of the switches 21, 22 will be described below: Refer to FIG. 3, when the control signal D1 generates a rising from a low voltage to a high voltage, the reaction end 54 conducts to the switch end 52 and connect to the input end $V_{in}$ of the high-voltage generator 2 (here define the voltage magnitude of the input $V_{in}$ as $V_{DD}$) according to the characteristics of the SPDT switch (see FIG. 4). At this time, the NMOS transistor in the first inverter 32 is turned on and the PMOS transistor is turned off, so that the output end of the first inverter 32 is maintained to the ground signal.

Since the control end of the first back SPDT transistor 33 is configured to receive the same control signal D1, therefore, the reaction end is connected to the output end of the first inverter 32, that is, remains at ground, so that the first transistor switch 34 is turned on. The voltage signal at the input end will be bypassed through the first transistor switch 34 without passing through the first stage charge pump 201. That is, the output voltage of the first stage charge pump 201 remains at $V_{DD}$.

Similarly, if the control signal D2 is falling from a high voltage to a low voltage, according to the characteristics of the SPDT switch, the reaction end will be connected to the switch end corresponding to the output end of the first inverter 32 and is maintained to the ground signal. At this time, the NMOS of the second inverter 42 is turned off and the PMOS is turned on so that the voltage at the output end of the second inverter 42 approaches $V_{DD}$.

Since the control end of the second back SPDT switch 43 is also configured to receive the same control signal D2, the reaction end of the second back SPDT switch 43 is connected to the switch end corresponding to the output end of the second stage charge pump 202. The second transistor switch 44 is turned off so as to the voltage $V_{DD}$ at the output end of the first stage charge pump 201 is boosted to $2V_{DD}$ through the second stage charge pump 202.

In the foregoing embodiment, the first transistor switch 34 and the second transistor switch 44 are PMOS transistors. In addition, FIG. 2 and FIG. 3 show a high-voltage generator with two charge pumps, but it may increase the number of charge pumps and switches to achieve more levels of boost function.

Figure 5:
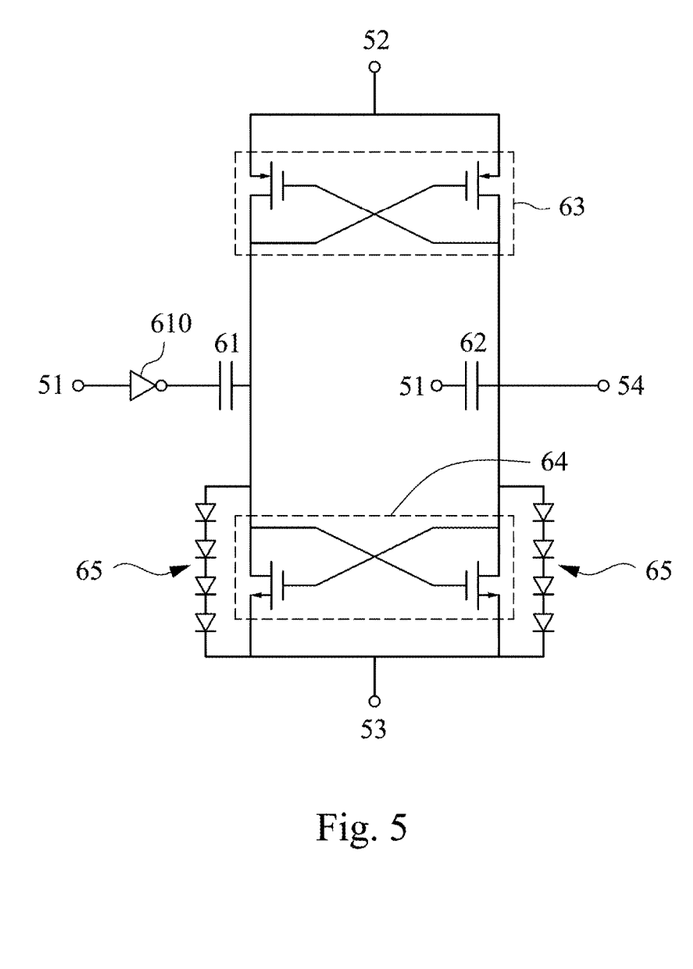
FIG. 5 is a schematic circuit diagram of a front SPDT switch of the present disclosure.

In addition, the structure of the front SPDT switch (i.e. corresponding to the first front SPDT switch 31 and the second front SPDT switch 41) in the present disclosure is further described. Referring to FIG. 5, the front SPDT switch includes a first coupling capacitor 61, a second coupling capacitor 62, a first cross-coupled transistor 63, and a second cross-coupled transistor 64. One end of the first coupling capacitor 61 is electrically coupled to the control end 51 of the front SPDT switch through an inverter 610. One end of the second coupling capacitor 62 is electrically coupled to the control end 51 of the front SPDT switch, and the other end of the second coupling capacitor 62 is electrically coupled to the reaction end 54.

The first cross-coupled transistor 63 is electrically coupled to the first coupling capacitor 61, the second coupling capacitor 62, and a switch end 52 of the front SPDT switch 5. The second cross-coupled transistor 64 is electrically coupled to the first coupling capacitor 61, the second coupling capacitor 62 and the other switch end 53 of the SPDT switch 5. The signal phases of the control end 51 and the reaction end 54 are in phase.

When the control end 51 changes from a low voltage to a high voltage, the voltage of the reaction end 54 changes according to the following formula:

$$\Delta V = \frac{C_q \cdot V_{DD}}{C_q + C_{par}},$$

Wherein $C_q$ is the capacitor of the second coupling capacitor 62, $C_{par}$ is the parasitic capacitor of the reaction end 54, and $V_{DD}$ is the voltages across the two switch ends 52, 53. In this embodiment, the first cross-coupled transistor 63 uses a pair of NMOS transistors and the second cross-coupled transistor 64 uses a pair of PMOS transistors. In addition, the second cross-coupled transistor 64 is respectively connected with two bypass circuits 65 in parallel, and each of the bypass circuits 65 is consists of multiple diodes in series. When the voltage at the switch end 53 instantaneously falls, the instantaneous voltage variation bypass through the bypass circuit 65 to prevent the second cross-coupled transistor 64, the transistors in any of the charge pumps 201 and 202, and the switches 21 and 22 got damaged.

Figure 6:
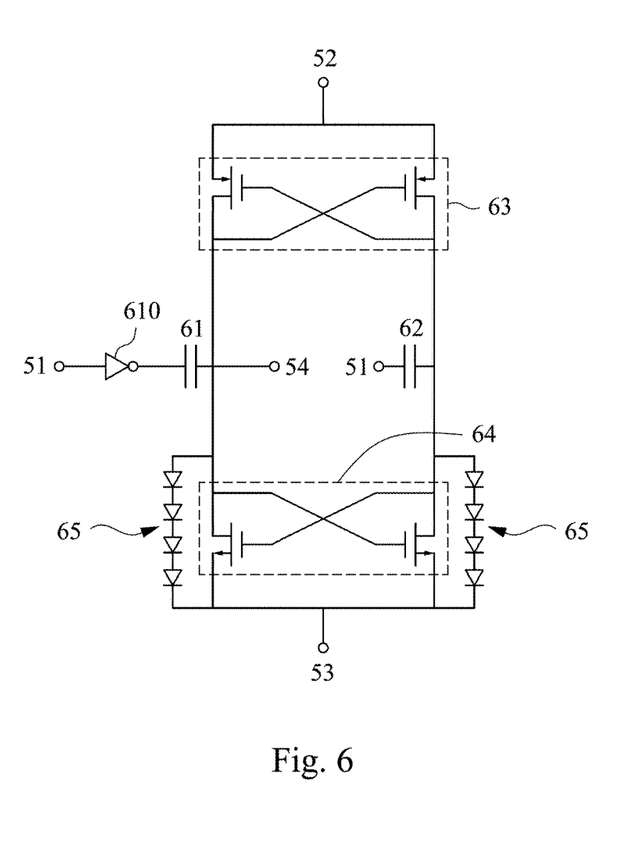
FIG. 6 is a schematic circuit diagram of a back SPDT switch of the present disclosure.

Similarly, refer to FIG. 6. FIG. 6 is a circuit diagram of the back SPDT switch (i.e. the first back SPDT transistor 33 and the second back SPDT switch 43). The back SPDT switch includes a first coupling capacitor 61, a second coupling capacitor 62, a first cross-coupled transistor 63 and a second cross-coupled transistor 64. One end of the first coupling capacitor 61 is electrically coupled to the control end 51 of the back SPDT through an inverter 610, and the other end of the first coupling capacitor 61 is coupled to the reaction end 54. One end of the second coupling capacitor 62 is electrically coupled to the control end 51 of the front SPDT switch 5.

The first cross-coupled transistor 63 is electrically coupled to the first coupling capacitor 61, the second coupling capacitor 62 and the switch end 52 of the front SPDT switch 5. The second cross-coupled transistor 64 is electrically coupled to the first coupling capacitor 61, the second coupling capacitor 62 and another switch end 53 of the SPDT switch 5. The signal phase of the control end 51 and the reaction end 54 is out of phase, and is slightly different from the front SPDT switch.

Comparing FIG. 5 and FIG. 6, the difference between the front SPDT switch and the back SPDT switch is that the reaction end 54 of each of the front SPDT switch is electrically coupled to the other end of the second coupling capacitor 62. The reaction end 54 of each of the back SPDT switch is electrically coupled to the other end of the first coupling capacitor 61, so that there is a phase difference between the signals at the reaction ends 54.

Referring to FIG. 2, in the present embodiment, the feedback circuit 23 includes a differential amplifier 231, a voltage-controlled oscillator 232 and a clock circuit 233. The input end of the differential amplifier 231 is electrically coupled to the output end $V_{out}$ of the high-voltage generator 2 and a reference voltage VR. The input end of the voltage-controlled oscillator 232 is electrically coupled to the output end of the differential amplifier 231. An input end of the clock circuit 233 is electrically coupled to an output end of the voltage-controlled oscillator 232. An output end of the clock circuit 233 is coupled to each of the charge pumps 201 and 202. The clock circuit 233 is configured to receive the input $V_{in}$ and output a clock signal with a corresponding frequency to the charge pump 201, 202 through the feedback signal of the voltage-controlled oscillator 232 so as to adjust the operating frequency of each charge pump 201 and 202.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A high-voltage generator with multi-stage selection in low-voltage transistor process, comprising:
   a boost circuit comprising at least a first stage charge pump and a second stage charge pump in series, wherein an input end of the first stage charge pump is electrically coupled to an input end of the high-voltage generator, an input end of the second stage charge pump is electrically coupled to an output end of the first stage charge pump, an output end of the second stage charge pump is electrically coupled to an output end of the high-voltage generator;
   at least a first stage switch and a second stage switch, wherein the first stage switch and the second stage switch are respectively connected in parallel with the first stage charge pump and the second stage charge pump, and each switch comprises at least one low-voltage transistor; and
   a feedback circuit electrically coupled to the output end of the high-voltage generator through a first end of the feedback circuit and electrically coupled to the charge pumps through a plurality of clock signal providing ends of the feedback circuit respectively, wherein when both of the first stage switch and the second stage switch are turned off, the high-voltage generator receives an input signal through the input end of the high-voltage generator, and boosts the input signal through the first stage charge pump and the second stage charge pump, sequentially; when the first stage switch is turned on and the second stage switch is turned off, the high-voltage generator boosts the input signal through the second stage charge pump, and voltages across ends of the first stage switch and voltages across ends of the second stage switch do not exceed one boost voltage difference.

2. The high-voltage generator of claim 1, wherein the first stage switch further comprises:
   a first front SPDT switch, wherein a control end of the first front SPDT switch is configured to receive a control signal, and two switch ends of the first front SPDT switch are electrically coupled to the input end of the first stage charge pump and a ground terminal, respectively;
   a first inverter, wherein an input end of the first inverter is electrically coupled to a reaction end of the first front SPDT switch;
   a first back SPDT switch, wherein a control end of the first back SPDT switch is configured to receive the control signal, and two switch ends of the first front SPDT switch are electrically coupled to the output end of the first stage charge pump and an output end of the first inverter, respectively; and
   a first transistor switch comprising at least one low-voltage transistor, wherein two ends of the first transistor switch are connected in parallel with the first stage charge pump, and a control end of the first transistor switch is electrically coupled to a reaction end of the first back SPDT switch.

3. The high-voltage generator of claim 2, wherein the second stage switch further comprises:
   a second front SPDT switch, wherein a control end of the second front SPDT switch is configured to receive another control signal, and two switch ends of the second front SPDT switch are electrically coupled to the input end of the second stage charge pump and the ground terminal, respectively;
a second inverter, wherein an input end of the second inverter is electrically coupled to a reaction end of the second front SPDT switch;
a second back SPDT switch, wherein a control end of the second back SPDT switch is configured to receive the another control signal, and two switch ends of the second front SPDT switch are electrically coupled to the output end of the second stage charge pump and an output end of the second inverter, respectively; and
a second transistor switch comprising at least one low-voltage transistor, wherein two ends of the second transistor switch are connected in parallel with the second stage charge pump, and a control end of the second transistor switch is electrically coupled to a reaction end of the second back SPDT switch.

4. The high-voltage generator of claim 3, wherein the low-voltage transistor, which is used in first transistor switch and the second transistor switch, is a NMOS transistor in the low-voltage process.

5. The high-voltage generator of claim 4, wherein a corresponding SPDT switch of the first front SPDT switch, the first back SPDT switch, the second SPDT switch and the second back SPDT switch comprises:
a first coupling capacitor, wherein one end of the first coupling capacitor is electrically coupled to a corresponding control end of the corresponding SPDT switch;
a second coupling capacitor, wherein one end of the second coupling capacitor is electrically coupled to the corresponding control end of the corresponding SPDT switch;
a first cross-coupled transistor, which is electrically coupled to the first coupling capacitor, the second coupling capacitor and a corresponding switch end of the corresponding SPDT switch; and
a second cross-coupled transistor, which is electrically coupled to the first coupling capacitor, the second coupling capacitor and another corresponding switch end of the corresponding SPDT switch.

6. The high-voltage generator of claim 5, wherein a corresponding reaction end of the corresponding SPDT switch is electrically coupled to another end of the second coupling capacitor.

7. The high-voltage generator of claim 5, wherein a corresponding reaction end of the corresponding SPDT switch is electrically coupled to another end of the first coupling capacitor.

8. The high-voltage generator of claim 5, wherein the second cross-coupled transistor is respectively connected in parallel with two bypass circuits, each of the bypass circuits comprises a plurality of diodes in series.

9. The high-voltage generator of claim 8, wherein the first cross-coupled transistor uses a PMOS transistor, and the second cross-coupled transistor uses a NMOS transistor.

10. The high-voltage generator of claim 9, wherein the feedback circuit comprises:
a differential amplifier, wherein an input end of the differential amplifier is electrically coupled to the output end of the high-voltage generator and a reference voltage;
a voltage-controlled oscillator, wherein an input end of the voltage-controlled oscillator is electrically coupled to an output end of the differential amplifier; and
a dock circuit, wherein an input end of the dock circuit is electrically coupled to an output end of the voltage-controlled oscillator, and an output end of the dock circuit is electrically coupled each charge pump.

* * * * *